US012518944B2

(12) United States Patent
Somehara et al.

(10) Patent No.: US 12,518,944 B2
(45) Date of Patent: Jan. 6, 2026

(54) ELECTRON MICROSCOPE AND IMAGE ACQUISITION METHOD

(71) Applicant: JEOL Ltd., Tokyo (JP)

(72) Inventors: Kazunori Somehara, Tokyo (JP); Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 495 days.

(21) Appl. No.: 17/973,993

(22) Filed: Oct. 26, 2022

(65) Prior Publication Data

US 2023/0127255 A1 Apr. 27, 2023

(30) Foreign Application Priority Data

Oct. 27, 2021 (JP) ................................ 2021-175580

(51) Int. Cl.

*H01J 37/147* (2006.01)
*H01J 37/10* (2006.01)
*H01J 37/26* (2006.01)
*H01J 37/28* (2006.01)

(52) U.S. Cl.

CPC .......... *H01J 37/1478* (2013.01); *H01J 37/10* (2013.01); *H01J 37/263* (2013.01); *H01J 37/28* (2013.01)

(58) Field of Classification Search

CPC ........ H01J 37/00; H01J 37/1478; H01J 37/10; H01J 37/26; H01J 37/02; H01J 37/28; H01J 37/263; H01J 37/153; H01J 2237/1507; H01J 2237/2802

USPC .......................................... 250/306, 307, 311

See application file for complete search history.

(56) References Cited

U.S. PATENT DOCUMENTS

| | | | | |
|---|---|---|---|---|
| 9,997,331 B1 * | 6/2018 | Own | ....................... | H01J 37/28 |
| 2007/0075262 A1 * | 4/2007 | Winkler | .............. | H01J 37/1477 250/398 |
| 2007/0221860 A1 * | 9/2007 | Kawasaki | ........... | H01J 37/1478 250/398 |

(Continued)

FOREIGN PATENT DOCUMENTS

| | | |
|---|---|---|
| JP | 2013143197 A | 7/2013 |
| JP | 20164713 A | 1/2016 |
| JP | 201892805 A | 6/2018 |

OTHER PUBLICATIONS

Office Action issued in JP2021175580 on Oct. 3, 2023.

*Primary Examiner* — Jason L Mccormack
(74) *Attorney, Agent, or Firm* — The Webb Law Firm

(57) ABSTRACT

An electron microscope includes an electron source for emitting an electron beam, an illumination lens for focusing the beam, an aberration corrector for correcting aberrations, an illumination deflector assembly disposed between the illumination lens and the aberration corrector and operating to deflect the beam and to vary its tilt relative to a sample, a scanning deflector for scanning the sample with the beam, an objective lens, a detector for detecting electrons transmitted through the sample and producing an image signal, a control section for controlling the illumination deflector assembly, and an image generating section for receiving the image signal and generating a differential phase contrast (DPC) image. The tilt of the beam is varied by the illumination deflector assembly such that the image generating section generates a plurality of DPC images at different tilt angles of the beam and creates a final image based on the DPC images.

12 Claims, 6 Drawing Sheets

(56) References Cited

U.S. PATENT DOCUMENTS

| | | | | |
|---|---|---|---|---|
| 2014/0021366 | A1* | 1/2014 | Dohi | H01J 37/153 250/396 R |
| 2015/0001393 | A1 | 1/2015 | Kotake et al. | |
| 2016/0020066 | A1 | 1/2016 | Morishita | |
| 2018/0158646 | A1* | 6/2018 | Nakamura | H01J 37/28 |
| 2018/0366295 | A1* | 12/2018 | Morishita | H01J 37/28 |
| 2022/0414361 | A1* | 12/2022 | Potocek | G06V 10/92 |

* cited by examiner

ELECTRON MICROSCOPE AND IMAGE ACQUISITION METHOD

CROSS-REFERENCE TO RELATED APPLICATION

This application claims priority to Japanese Patent Application No. 2021-175580, filed Oct. 27, 2021, the disclosure of which is hereby incorporated by reference in its entirety.

BACKGROUND OF THE INVENTION

1. Field of the Invention

The present invention relates to an electron microscope and an image acquisition method.

2. Description of the Related Art

The differential phase contrast (DPC) technique is known which visualizes the electromagnetic field in a sample using a scanning transmission electron microscope. In the DPC technique, the visualization of the electromagnetic field is carried out by measuring the amount of deflection of an electron beam caused by the electromagnetic field within the sample.

When a sample having crystallinity is observed with a scanning transmission electron microscope, the thickness of the sample exhibits nonuniformity. Also, variations of the tilt of the sample create diffraction contrast. In the DPC technique, the effect of the diffraction contrast must be reduced.

For example, JP-A-2018-92805 discloses an image acquisition method for generating an image by varying the direction of incidence of an electron beam relative to a sample in order to reduce the effect of diffraction contrast, deriving a plurality of differential phase contrast (DPC) images, and accumulating these DPC images. Contrast created in the DPC method does not vary or varies minimally according to the direction of incidence of the electron beam relative to the sample. However, diffraction contrast varies sensitively depending upon the direction of incidence of an electron beam relative to a sample. Therefore, the effect of diffraction contrast can be reduced by accumulating plural DPC images for which the direction of incidence of the electron beam relative to the sample is different from each other.

If the tilt of the electron beam relative to the sample is varied by deflecting the beam with a deflector as set forth in JP-A-2018-92805, the beam does not pass through the center of the objective lens, producing geometric aberrations such as astigmatism and coma, whereby the image may be blurred.

SUMMARY OF THE INVENTION

One aspect of the electron microscope associated with the present invention comprises: an electron source for emitting an electron beam; an illumination lens for focusing the emitted electron beam; an aberration corrector for correcting aberrations; an illumination deflector assembly disposed ahead of the aberration corrector and operating to deflect the electron beam and to vary its tilt relative to a sample; a scanning deflector for scanning the sample with the electron beam; an objective lens; a detector for detecting electrons transmitted through the sample and producing an image signal; a control section for controlling the illumination deflector assembly; and an image generating section for receiving the image signal and generating a differential phase contrast (DPC) image. The tilt of the beam is varied by the illumination deflector assembly such that the image generating section generates a plurality of DPC images at plural different tilt angles of the electron beam and creates a final image based on the plurality of DPC images.

In this electron microscope, the electron beam is tilted with the illumination deflector assembly disposed ahead of the aberration corrector. Therefore, the geometric aberrations in the objective lens caused by the tilt of the electron beam can be canceled out by the geometric aberrations in the aberration corrector produced by the tilt of the beam. Consequently, variations of the geometric aberrations due to tilt of the beam can be reduced. Hence, high-quality differential phase contrast images can be obtained.

One aspect of the image acquisition method associated with the present invention is for use in an electron microscope operative to detect electrons transmitted through a sample and to acquire a differential phase contrast image indicative of the distribution of electromagnetic field in the sample. The image acquisition method starts with varying tilt of an electron beam relative to the sample under control of an illumination deflector assembly disposed ahead of an aberration corrector and acquiring a plurality of differential phase contrast (DPC) images. A final image is created based on the DPC images.

In this image acquisition method, the electron beam is tilted with the illumination deflector assembly located ahead of the aberration corrector and so the geometric aberrations caused in the objective lens due to tilt of the beam can be canceled out by the geometric aberrations in the aberration corrector due to tilt of the beam. Consequently, variations of the geometric aberrations caused by tilt of the electron beam can be reduced and thus high-quality differential phase contrast images can be obtained.

DESCRIPTION OF THE INVENTION

Non-limiting embodiments of the present invention are hereinafter described in detail with reference to the drawings. It is to be understood that the embodiments set forth below are not intended to unduly restrict the content of the present invention delineated by the claims and that not all the configurations set forth hereinafter are essential constituent components of the present invention.

1. Electron Microscope

Figure 1:
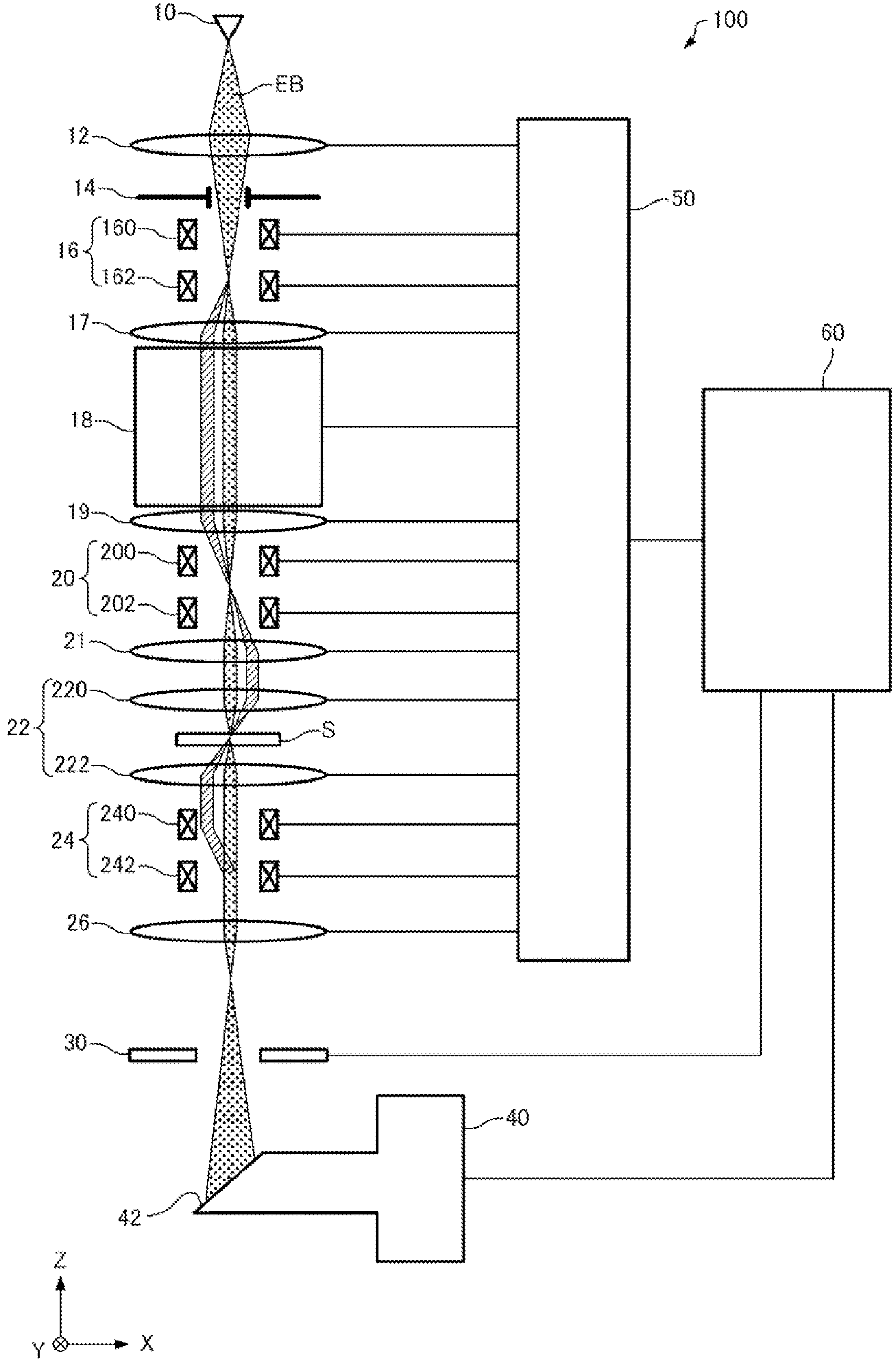
FIG. 1 is a diagram showing the configuration of an electron microscope associated with one embodiment of the present invention.

First, an electron microscope associated with one embodiment of the present invention is described by referring to FIG. 1, which shows the configuration of the electron microscope, 100. In FIG. 1, X, Y, and Z axes are shown as three mutually perpendicular axes. The Z axis runs parallel to the optical axis of the optical system of the electron microscope 100.

The electron microscope 100 can acquire differential phase contrast (DPC) images using a DPC technique which is one type of scanning transmission electron microscopy that visualizes an electromagnetic field within a sample by measuring the degree or angle of deflection of an electron beam caused by the electromagnetic field at each scan point. A DPC image is a scanning electron microscopy (STEM) image that has been generated by visualizing the electromagnetic field within a sample by a DPC technique.

As shown in FIG. 1, the electron microscope 100 includes an electron source 10, an illumination lens 12, an illumination aperture assembly 14, an illumination deflector assembly 16, an aberration corrector 18, a scanning deflector 20, an objective lens 22, an imaging deflector 24, an imaging lens 26, an annular dark field (ADF) detector 30, a segmented detector 40, a controller 50, and an information processor 60.

The electron source 10 is made of an electron gun, for example, and operates to emit an electron beam EB. The illumination lens (condenser lens) 12 focuses the electron beam EB emitted from the electron source 10. The illumination aperture assembly (condenser aperture assembly) 14 has a plurality of restricting holes of different diameters, for example, and operates to cut off undesired portions of the electron beam EB and to determine the angular aperture of the electron beam EB and the dose of the electron beam EB.

The illumination deflector assembly 16 is disposed between the illumination lens 12 and the aberration corrector 18, more specifically between the illumination aperture assembly 14 and the aberration corrector 18, and is located ahead of the aberration corrector 18, i.e., closer to the electron source 10 than is the aberration corrector 18.

The illumination deflector assembly 16 deflects the electron beam EB in two dimensions. By deflecting the electron beam EB with the illumination deflector assembly 16, the tilt of the beam EB relative to the sample S can be varied.

Figure 2:
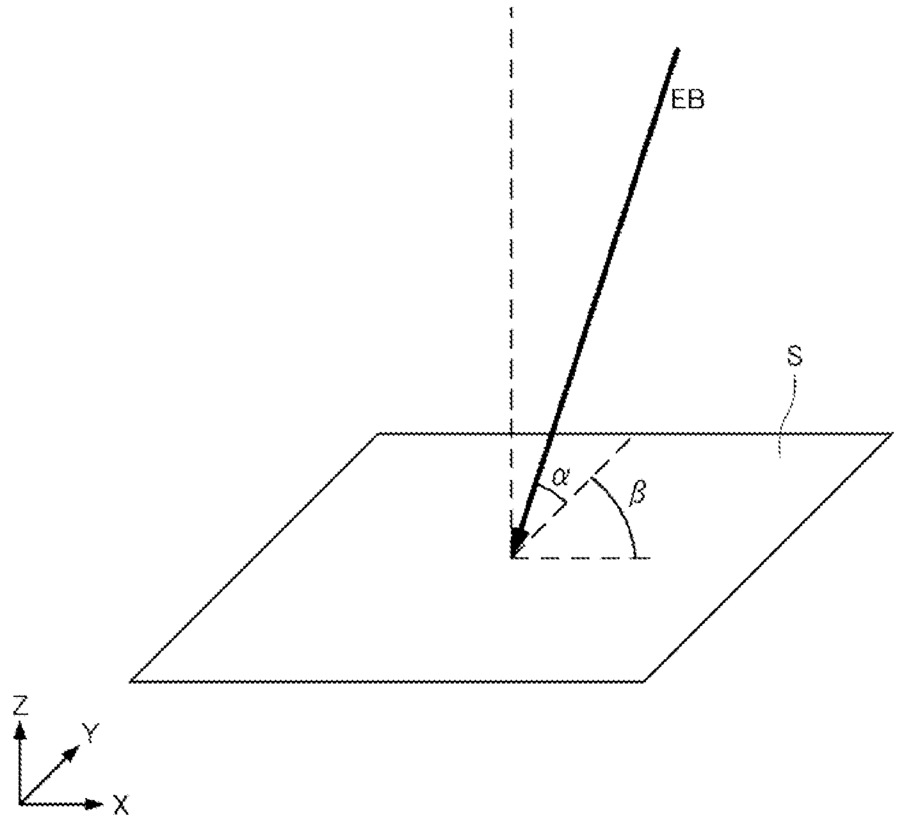
FIG. 2 is a geometric representation illustrating tilt of an electron beam.

FIG. 2 is a geometric representation illustrating tilt of the electron beam EB relative to the sample S. The tilt of the electron beam EB relative to the sample S is represented in terms of its angle $\alpha$ and direction $\beta$. Tilting the electron beam EB differently is to make different at least one of the angle $\alpha$ and direction $\beta$ of the tilt.

The illumination deflector assembly 16 is a multi-stage deflection system. In the illustrated example, the deflector assembly 16 is a two-stage deflection system including a first deflection subsystem 160 and a second deflection subsystem 162 which are arranged in the first and second stages, respectively.

Figure 3:
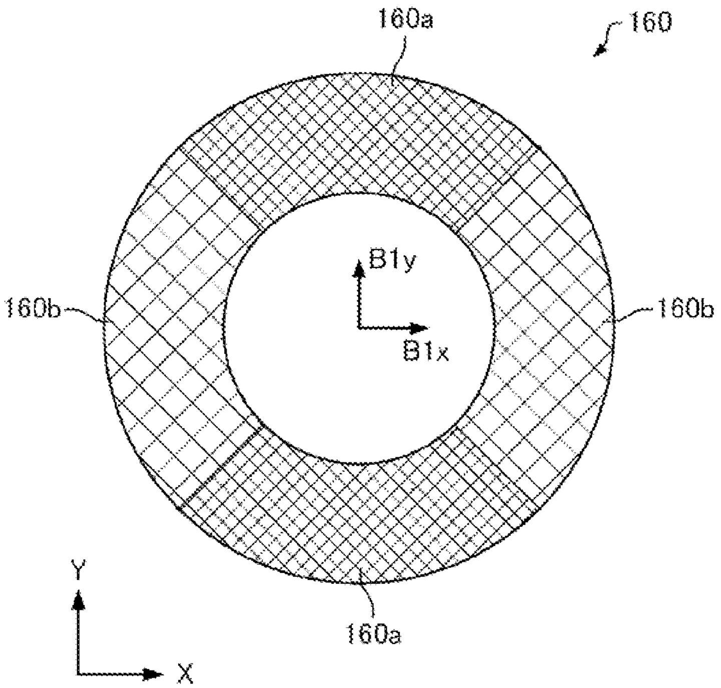
FIG. 3 is a schematic representation of a first deflection subsystem.

FIG. 3 schematically shows the first deflection subsystem 160 arranged in the first stage. The first deflection subsystem 160 includes a first deflector 160*a* and a second deflector 160*b*. The first deflector 160*a* produces a magnetic field B1*x* to deflect the electron beam EB along the Y axis. The second deflector 160*b* produces a magnetic field B1*y* to deflect the beam EB along the X axis. The first deflector 160*a* includes two coils for producing magnetic fields, for example, in the X direction, the two coils being arranged symmetrically with respect to the optical axis. The second deflector 160*b* includes two coils for setting up magnetic fields, for example, in the Y direction, the two coils being arranged symmetrically with respect to the optical axis.

Figure 4:
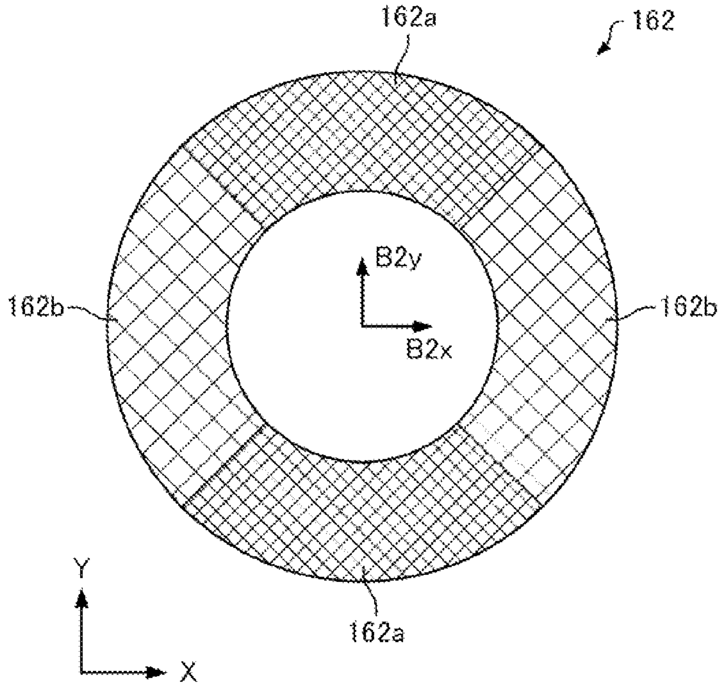
FIG. 4 is a schematic representation of a second deflection subsystem.

FIG. 4 schematically shows the second deflection subsystem 162. The second deflection subsystem 162 includes a third deflector 162*a* and a fourth deflector 162*b*. The third deflector 162*a* produces a magnetic field B2*x* to deflect the electron beam EB along the Y axis. The fourth deflector 162*b* generates a magnetic field B2*y* to deflect the beam EB along the X axis. The third deflector 162*a* includes two coils for producing magnetic fields, for example, in the X direction, the two coils being arranged symmetrically with respect to the optical axis. The fourth deflector 162*b* includes two coils for producing magnetic fields, for example, in the Y direction, the two coils being arranged symmetrically with respect to the optical axis.

When a tilt signal is supplied from the controller 50, the illumination deflector assembly 16 causes the first deflector 160*a*, second deflector 160*b*, third deflector 162*a*, and fourth deflector 162*b* to deflect the electron beam EB in proportion to the amplitude of the tilt signal. The ratio of the output levels of these four deflectors is referred to herein as the deflection ratio which can be adjusted as described later.

The aberration corrector 18 corrects aberrations, e.g., corrects aberrations in the objective lens 22 by producing aberrations for cancelling out the aberrations in the objective lens 22. For example, the aberration corrector 18 corrects spherical aberration produced in the objective lens 22. A transfer lens 17 is disposed between the illumination deflector assembly 16 and the aberration corrector 18, while another transfer lens 19 is located between the aberration corrector 18 and the scanning deflector 20.

The scanning deflector 20 is used to scan the sample S with the electron beam EB, and deflects the beam EB in two dimensions. When a scan signal is supplied from the controller 50, the scanning deflector 20 raster scans the sample S with the electron beam EB, whereby a STEM image can be derived.

The scanning deflector 20 is a multi-stage deflection system in the same manner as the illumination deflector assembly 16. In the illustrated example, the deflector 20 is a two-stage deflection system and includes a first deflection subsystem 200 and a second deflection subsystem 202 which are arranged in the first and second stages, respectively. A transfer lens 21 is disposed between the scanning deflector 20 and the objective lens 22.

The objective lens 22 forms a front magnetic lens 220 in front of the sample S and a rear magnetic lens 222 behind the sample S. The front magnetic lens 220 focuses the electron beam EB into an electron probe. The rear magnetic lens 222 is used such that electrons transmitted through the sample S are focused and imaged.

The imaging deflector 24 is disposed behind the objective lens 22 and incorporated in the imaging system of the electron microscope 100. The imaging deflector 24 provides two-dimensional deflection of the electron beam EB transmitted through the sample S and corrects the positional deviation of the image created by the electron beam EB on the photosensitive surface 42 of the segmented detector 40 by tilting the electron beam EB with the illumination deflector assembly 16.

The imaging deflector 24 is a multi-stage deflection system in the same way as the illumination deflector assembly 16. In the illustrated example, the deflector 24 is a two-stage deflection system and includes a first deflection subsystem 240 and a second deflection subsystem 242 which are arranged in the first and second stages, respectively. Alternatively, the imaging deflector 24 may be a single-stage deflection system.

The imaging lens 26 includes an intermediate lens and a projector lens, for example, and operates to focus and image the electron beam on the segmented detector 40. The ADF detector 30 is of an annular form and detects electrons inelastically scattered from the sample S. Consequently, a dark field STEM image can be generated.

Figure 5:
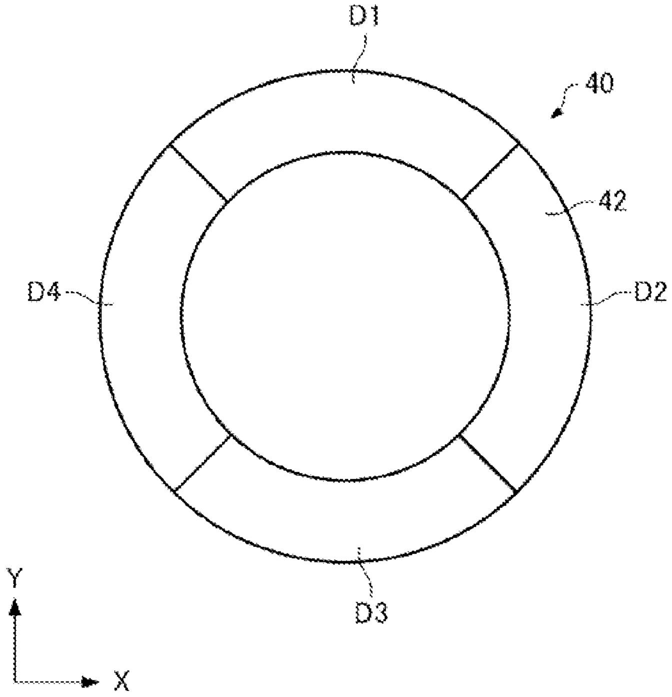
FIG. 5 is a schematic representation of the photosensitive surface of a segmented detector.

In the segmented detector 40, the photosensitive surface 42 for detecting electrons transmitted through the sample S is split into plural detector segments. The photosensitive surface 42 of the segmented detector 40 is schematically shown in FIG. 5. The annular or toroidal photosensitive surface 42 is circumferentially equally divided into detector segments D1, D2, D3, and D4 each of which can detect electrons independently.

No restriction is imposed on the number of detector segments of the photosensitive surface 42. The photosensitive surface 42 of the segmented detector 40 may be divided along radial and circumferential directions. For example, the segmented detector 40 may be radially divided into 4 sections and circumferentially divided into 4 sections, whereby the detector 40 may have 16 detector segments.

The segmented detector 40 includes an electron-to-light converter (scintillator) operative to convert electrons into light and having plural detector segments D1, D2, D3, and D4, optical transmission paths (a bundle of optical fibers) splitting the electron-to-light converter into the plural detector segments D1, D2, D3, and D4 and operating to transmit output light beams from the detector segments D1-D4, and a plurality of optical detectors (photomultiplier tubes) for converting the light beams into corresponding electrical signals. The segmented detector 40 transmits detection signals corresponding to the detected amounts of electrons from the detector segments D1, D2, D3, and D4 to the information processor 60. The segmented detector 40 may also be a semiconductor detector having a plurality of detector segments.

The controller 50 operates various portions of the electron microscope 100, for example, in response to control signals from the information processor 60. For this purpose, the controller 50 creates a scan signal and a tilt signal in response to the control signals, for example, from the information processor 60.

The information processor 60 controls various portions of the electron microscope 100. The information processor 60 creates a dark field STEM image based on the detection of electrons made by the ADF detector 30. Also, the information processor 60 creates a DPC image based on the detection of electrons performed by the segmented detector 40.

Figure 6:
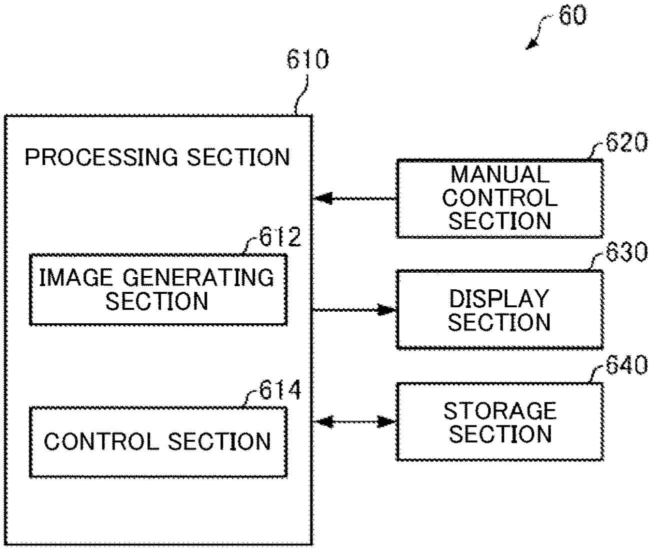
FIG. 6 is a diagram illustrating the configuration of an information processor.

FIG. 6 shows the configuration of the information processor 60. The information processor 60 includes a processing section 610, a manual control section 620, a display section 630, and a storage section 640.

The manual control section 620 permits a user to enter control information about manipulative actions and outputs the entered information to the processing section 610. The function of the manual control section 620 can be realized by a keyboard, a mouse, buttons, a touch panel display, or other piece of hardware.

The display section 630 operates to display the image created by the processing section 610. The function of the display section 630 can be implemented by an LCD, a CRT, or the like.

Computer programs and various kinds of data are stored in the storage section 640 to enable a computer to operate as various parts of the processing section 610. The storage section 640 also operates as a working area for the processing section 610. The function of the storage section 640 can be implemented by a hard disk, a RAM (random access memory), or the like.

The processing section 610 performs various control operations and calculational operations in accordance with programs stored in the storage section 640. The processing section 610 functions as a control section 614 and an image generating section 612 described later by executing programs stored in the storage section 640, i.e., includes the control section 614 and the image generating section 612. The functions of the processing section 610 can be realized by executing programs with various processors (such as a CPU (central processing unit)). At least some of the functions of the processing section 610 may be implemented using a dedicated circuit such as an ASIC (e.g., a gate array)).

The image generating section 612 generates a DPC image based on the detection of electrons performed by the segmented detector 40. In particular, the image generating section 612 receives detection signals from the detector segments D1, D2, D3, and D4 of the segmented detector 40 and arithmetically processes (e.g., additions and subtractions) the detection signals to find the direction and amount of deflection of the electron beam EB caused by the electromagnetic field in the sample S, thus generating the DPC image indicative of the distribution of the electromagnetic field in the sample S.

For example, the amount of deflection of the electron beam EB in the Y direction caused by the electromagnetic field in the sample S can be found from the difference, I1−I3, between the detection signal I1 from the detector segment D1 and the detection signal I3 from the detector segment D3. Also, the amount of deflection of the electron beam EB in the X direction caused by the electromagnetic field in the sample S can be found from the difference, I2−I4, between the detection signal I2 from the detector segment D2 and the detection signal I4 from the detector segment D4.

The control section 614 controls various portions of the electron microscope 100 and performs processing, for example, to acquire DPC images. Furthermore, the control section 614 operates to determine the deflection ratio of the first deflector 160*a*, second deflector 160*b*, third deflector 162*a*, and fourth deflector 162*b*.

2. Image Acquisition Method

2.1. Fundamental Operation

In the electron microscope 100, the sample S is irradiated with the electron beam EB while varying the tilt of the beam EB relative to the sample S with the illumination deflector assembly 16. Thus, plural DPC images are obtained at different angles of the tilt of the beam EB and averaged accumulatively. As a result, a DPC image having reduced diffraction contrast can be obtained.

2.2. Operation of Illumination Deflector Assembly

The illumination deflector assembly 16 tilts the electron beam EB relative to the sample S according to the tilt signal by operating the first deflector 160*a*, second deflector 160*b*, third deflector 162*a*, and fourth deflector 162*b* in an interlocking manner.

When the electron beam EB is tilted along the Y axis, the first deflector 160*a*, third deflector 162*a*, and fourth deflector 162*b* are operated in an interlocking manner. For example, when the electron beam EB is tilted under the condition where the tilt direction $\beta$ is +Y direction and the tilt angle $\alpha=\theta$, the beam EB is deflected in the +Y direction up to the tilt angle $\alpha=\theta$ with the first deflector 160*a* and then the beam EB is deflected back with the third deflector 162*a*.

At this time, if the illumination deflector assembly is ideal, the position of a crossover lies in the plane of deflection and so if the electron beam EB is tilted, the position of the electron beam EB on the sample S does not vary. In practice, however, the position of the crossover deviates from the plane of deflection by the effects of astigmatism and other factors in the plane of deflection. Therefore, if the electron beam EB is deflected with the first deflector 160*a* and the beam EB is deflected back with the third deflector 162*a*, the position of the beam EB on the sample S may deviate in the X direction.

For this reason, the positional deviation of the electron beam EB on the sample S is corrected with the third deflector 162*a* and fourth deflector 162*b*. As a result, the positional deviation of the electron beam EB on the sample S due to its tilting can be reduced.

Similarly, where the electron beam EB is tilted along the X axis, the second deflector 160*b*, third deflector 162*a*, and fourth deflector 162*b* are operated interlockingly. Consequently, positional deviation of the electron beam EB on the sample S can be corrected and reduced by the third deflector 162*a* and fourth deflector 162*b*.

2.3. Determination of Deflection Ratio

The deflection ratio that determines the ratio of the output levels of the first deflector 160*a*, third deflector 162*a*, and fourth deflector 162*b* when the electron beam EB is tilted along the Y axis can be determined experimentally.

Figure 7:
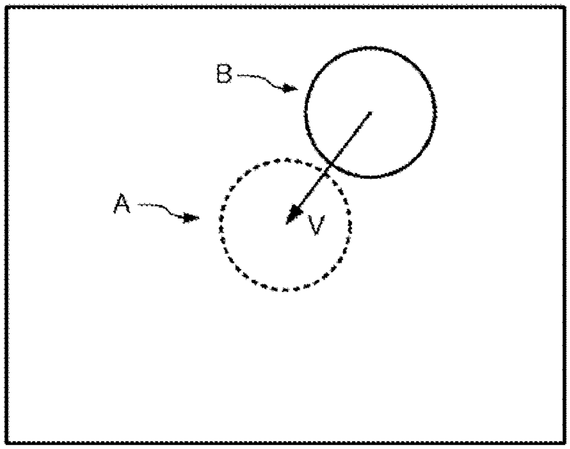
FIG. 7 is a diagram illustrating a method of determining a deflection ratio.

FIG. 7 illustrates a method of determining the deflection ratio. A STEM image A produced before the electron beam EB is tilted and a STEM image B produced after the tilt are shown to be overlapped.

First, the STEM image A is acquired and then the electron beam EB is deflected along the Y axis with the first deflector 160*a*. The beam EB is deflected back with the third deflector 162*a* to an amount proportional to the deflection made by the first deflector 160*a*. Then, the STEM image B is acquired.

Then, the amount and direction of the deviation in field of view (FOV) between the STEM images A and B are measured, and a field of view (FOV) deviation vector V indicative of the amount and direction of the FOV deviation is obtained. The amount of deflection caused by the third deflector 162*a* and the amount of deflection caused by the fourth deflector 162*b* are found from the FOV deviation vector V in relation to an amount of deflection caused by the first deflector 160*a*. That is, the deflection ratio of the first deflector 160*a*, third deflector 162*a*, and fourth deflector 162*b* which makes the vector V zero is found and determined.

Because the tilt angle of the electron beam EB relative to the sample S is in proportion to the amount of deflection, a measurement for determining the deflection ratio needs to be carried out only for one tilt angle.

The deflection ratio of the second deflector 160*b*, third deflector 162*a*, and fourth deflector 162*b* when the electron beam EB is tilted along the X axis can be determined similarly to the above-described deflection ratio of the first deflector 160*a*, third deflector 162*a*, and fourth deflector 162*b*.

A positional deviation of the electron beam EB on the sample S due to tilting of the beam EB varies according to optical conditions and, therefore, it is desired to perform the above-described measurement to find the deflection ratio whenever the optical conditions are varied.

The amount of positional deviation of the electron beam EB on the sample S when the beam EB is tilted varies according to geometric conditions. For example, where a STEM image is acquired, the focus is often adjusted and so variations of the deflection ratio with varying the focus may be found in advance, in which case the deflection ratio can be varied in conformity with variation of the focus.

In the foregoing description, the deflection ratio is determined from the deviation in field of view between the STEM image A generated before the electron beam EB is tilted and the STEM image B generated after the tilt of the beam EB. The method of determining the deflection ratio is not restricted to this method.

For example, plural STEM images are acquired at different tilt angles of the electron beam EB and accumulatively averaged to produce an averaged image, and the deflection ratio is determined based on blur of the averaged image. That is, the deflection ratio can be found by setting the third deflector 162*a* and fourth deflector 162*b* in such a way as to reduce the blur of the averaged image.

2.4. Scanning Method

Figure 8:
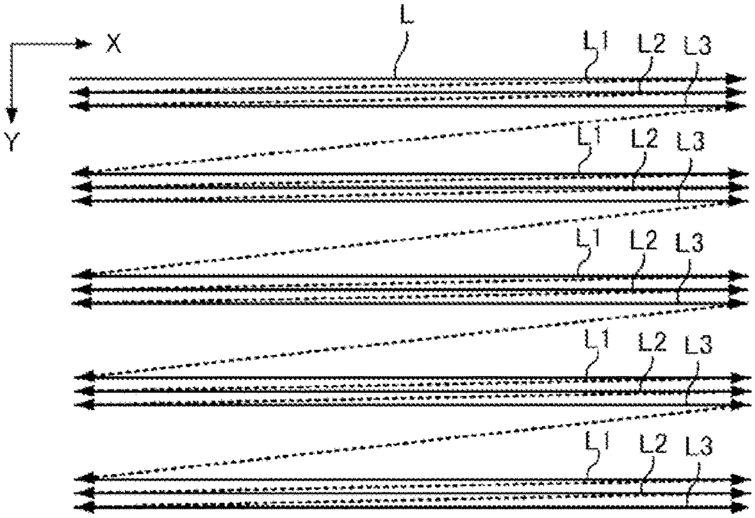
FIG. 8 is a diagram illustrating the manner in which a sample is scanned with an electron beam.
Figure 9:
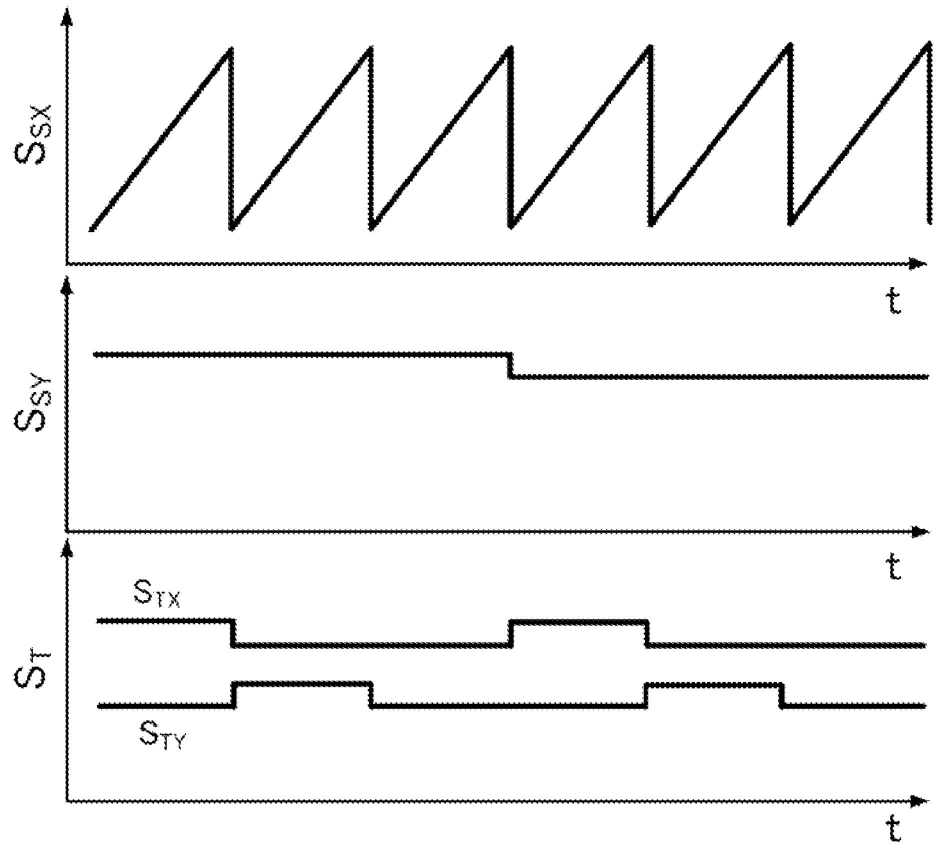
FIG. 9 is a waveform diagram showing one example of scan signal and one example of tilt signal.

FIG. 8 illustrates the manner in which the sample S is scanned with the electron beam EB. FIG. 9 shows examples of a scan signal $S_{SX}$ in the X direction, a scan signal $S_{SY}$ in the Y direction, a tilt signal $S_{TX}$ in the X direction, and a tilt signal $S_{TY}$ in the Y direction. A method of acquiring three DPC images at different tilt angles of the electron beam EB is now described.

In the electron microscope 100, scanning of the sample S with the electron beam EB is carried out by deflecting the beam EB with the scanning deflector 20 and drawing a plurality of scanning lines L. In the example shown in FIG. 8, three scanning lines L are drawn along the X axis and then the beam EB is moved in the +Y direction. Three scanning lines L are drawn. This process is repeated to scan the sample S with the electron beam EB. The three scanning lines L1, L2, and L3 scan the same area of the sample S.

In the illustrated example, the electron beam EB is moved in the +X direction and the scanning line L1 is drawn. Then, the beam EB is moved in the −X direction and the beam EB is deflected back to the starting point of the scanning line L1. Then, the beam EB is moved in the +X direction and the scanning line L2 is drawn. Thereafter, the beam EB is moved in the −X direction and deflected back to the starting point of the scanning line L2. Then, the beam EB is moved in the +X direction and the scanning line L3 is drawn. Thereafter, the beam EB is moved in the −X direction and deflected back. The beam EB is also moved in the +Y direction. This sequence of process steps is repeated to scan the sample S with the electron beam EB.

If the tilt signal $S_{TX}$ is supplied to the illumination deflector assembly 16, the second deflector 160*b*, third deflector 162*a*, and fourth deflector 162*b* operate in proportion to the amplitude of the tilt signal $S_{TX}$. The outputs (amounts of deflection) of the second deflector 160*b*, third deflector 162*a*, and fourth deflector 162*b* are determined by the tilt signal $S_{TX}$ and the deflection ratio.

Similarly, if the tilt signal $S_{TY}$ is supplied to the illumination deflector assembly 16, then the first deflector 160*a*, third deflector 162*a*, and fourth deflector 162*b* operate in proportion to the amplitude of the tilt signal $S_{TY}$. The outputs (amounts of deflection) of the first deflector 160*a*, third deflector 162*a*, and fourth deflector 162*b* are determined by the tilt signal $S_{TY}$ and the deflection ratio.

As shown in FIG. 9, the electron beam EB is tilted differently according to which of the scanning lines L1, L2, and L3 is being drawn. By acquiring three DPC images in such a way that the tilt of the electron beam EB is varied whenever one scanning line L is drawn as described above, the effect of sample drift can be reduced. Hence, the deviation in field of view between the three DPC images can be reduced.

Three scanning lines L (L1, L2, L3) are drawn across each of scanning points on the sample S while tilting the beam differently for each of these three lines L. The resulting image signals are accumulatively averaged and a final image can be displayed. In particular, a first image signal arises by drawing the scanning line L1. A second image signal is produced by drawing the scanning line L2. A third image signal is generated by drawing the scanning line L3. These three image signals are averaged and thus an image can be created in real time. Therefore, the human operator can adjust aberrations or the position of the electron beam EB on the photosensitive surface 42 while watching the STEM image which is affected less by the effects of diffraction contrast.

2.5. Control of Timing at which Tilt is Varied

The scan signal $S_{SX}$, scan signal $S_{SY}$, tilt signal $S_{TX}$, and tilt signal $S_{TY}$ are in synchronism. As shown in FIG. 9, the tilt of the electron beam EB is varied during flyback in which the electron beam EB is deflected back after drawing one scanning line L in preparation to draw the next scanning line L.

Figure 10:
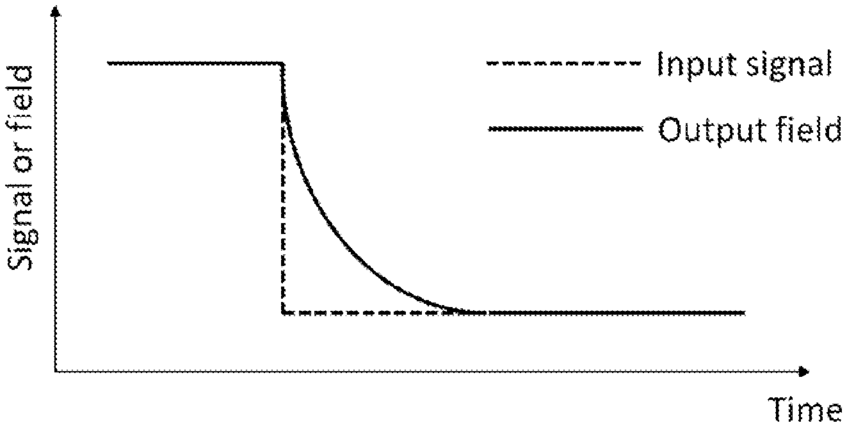
FIG. 10 is a waveform diagram showing one example of a tilt signal.
Figure 11:
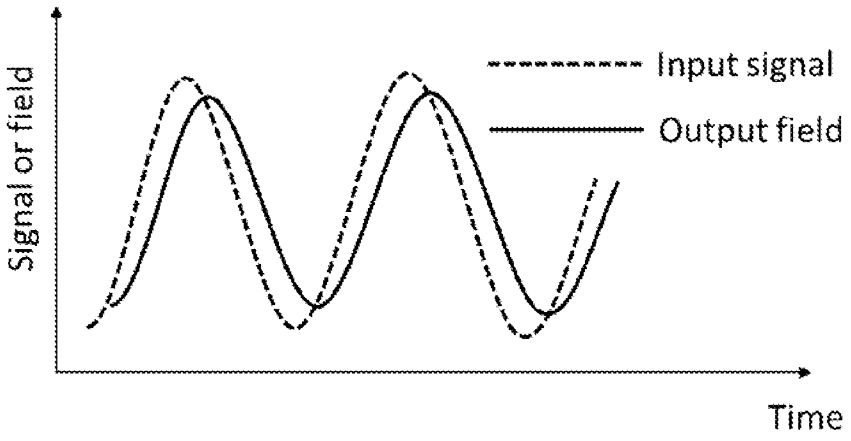
FIG. 11 is a waveform diagram showing another example of a tilt signal.

FIGS. 10 and 11 show examples of the waveform of the tilt signal $S_{TX}$. Each deflector composing the illumination deflector assembly 16 has a finite response speed and, therefore, magnetic fields produced by the deflectors have output waveforms which are distorted from the waveform (input waveform) of the input tilt signal $S_{TX}$ as shown in FIG. 10. Since the distortion varies according to amplitude and frequency, it is not easy to maintain constant the deflection ratio of the deflectors under the presence of such distortion.

As shown in FIG. 11, if a triangular waveform or a sinusoidal waveform consisting of only a given frequency is used as an input waveform, for example, variations of the output waveform in response to the input waveform can be reduced. However, the distribution of the tilt angles of the electron beam EB is restricted to a circular or elliptical form. Also, if a triangular function is used as an input waveform, the gain varies or responds with delay due to frequency and so it is difficult to adjust the deflection ratio of the deflectors.

In the electron microscope 100, variation of the tilt of the electron beam EB is done during flyback as described above. As a result, no image signal is acquired during the response time of the deflectors. This can reduce the effects of distortion of the output waveforms on the input waveform shown in FIG. 10. That is, it is possible to reduce image deviation due to positional deviation of the electron beam EB caused by variation of the tilt of the electron beam EB.

Since variation of the tilt of the electron beam EB is carried out during flyback as described previously, the distribution of the tilt angles of the electron beam EB is not restricted to a circular or elliptical form. Accordingly, the user can specify or set the tilt angle of the electron beam EB to any desired value. Where a uniform field within a crystal is observed, for example, the electron beam EB can be scanned in such a way that the distribution of its tilt angles is uniform for all directions. Furthermore, where a field close to a crystal grain boundary is observed, the electron beam EB can be tilted only in a direction that is parallel to the grain boundary.

2.6. Aberrations in Objective Lens

As shown in FIG. 1, in the electron microscope 100, the illumination deflector assembly 16 for tilting the electron beam EB is disposed ahead of the aberration corrector 18. Because the illumination deflector assembly 16 is located ahead of the objective lens 22 in the electron microscope 100, if the electron beam EB is tilted with the illumination deflector assembly 16, the beam EB does not pass through the center of the objective lens 22. This causes geometric aberrations such as coma and astigmatism in the objective lens 22.

In the electron microscope 100, the illumination deflector assembly 16 is positioned ahead of the aberration corrector 18 and, therefore, if the electron beam EB is tilted with the deflector assembly 16, the beam EB does not pass through the center of the aberration corrector 18. Consequently, geometric aberrations caused by tilting of the electron beam EB in the objective lens 22 can be canceled out by geometric aberrations produced in the aberration corrector 18 due to tilting of the electron beam EB insomuch as the deflector assembly 16 is located ahead of the aberration corrector 18. As a result, variations of geometric aberrations due to tilting of the electron beam EB can be reduced.

2.7. Aberrations in Illumination Lens

Aberrations produced in the optical system of the electron microscope 100 are dominated by the aberrations in the objective lens 22. However, where the demagnification factor of the electron beam EB in the illumination system is small, the illumination lens 12 and the electron source 10 (such as an electron gun) produce large aberrations, in which case if the electron beam EB is tilted ahead of the aberration corrector 18, variations of the geometric aberrations may no longer be neglected.

In this case, the aberrations occurring in the objective lens 22 are varied by tilting the electron beam EB with the scanning deflector 20 to thereby correct aberrations produced in the illumination lens 12 and in the electron source 10. For example, a tilt component is added to the scanning deflector 20 in proportion to the tilt of the electron beam EB caused by the illumination deflector assembly 16. Consequently, aberrations produced in the illumination lens 12 and in the electron source 10 can be corrected. Aberrations produced in the illumination lens 12 and in the electron source 10 can be corrected, for example, by adding the tilt component to the scan signal in proportion to the tilt signal level.

3. Operation of Electron Microscope

In the electron microscope 100, a plurality of DPC images are created from different tilt angles of the electron beam EB while varying the tilt of the electron beam EB relative to the sample S with the illumination deflector assembly 16. The DPC images are accumulatively averaged, whereby a final image is created.

The control section 614 determines the deflection ratio of the first deflector 160*a*, second deflector 160*b*, third deflector 162*a*, and fourth deflector 162*b* by acquiring the STEM image A prior to tilting of the electron beam EB as shown in FIG. 7 and the STEM image B subsequently to the tilting of the beam EB and finding the vector V indicative of the deviation in field of view between these STEM images A and B as already described in "2.2. Determination of Deflection Ratio".

If an instruction for starting an operation for acquiring a DPC image is entered, the control section 614 generates a control signal to scan the sample S with the electron beam EB. The controller 50 receives the control signal and supplies responsive signals $S_{SX}$ and $S_{SY}$ to the scanning deflector 20. The control section 614 generates a control signal to vary the tilt of the electron beam EB whenever one scanning line L is drawn. The controller 50 receives the control signal and supplies corresponding tilt signals $S_{TX}$ and $S_{TY}$ to the illumination deflector assembly 16.

The sample S is scanned with the electron beam EB by drawing three scanning lines L across the same position on the sample S along the X axis, moving the beam EB in the +Y direction, and drawing three scanning lines L. This process is repeated. At this time, the tilt of the electron beam EB is varied during flyback from drawing of one scanning line L until drawing of the next scanning line L by the illumination deflector assembly 16.

The control section 614 operates the imaging deflector 24 in an interlocking manner with the illumination deflector assembly 16 to correct the positional deviation of the image created by the electron beam EB on the photosensitive surface 42 due to tilting of the beam with the illumination deflector assembly 16. Also, the control section 614 causes the scanning deflector 20 to tilt the electron beam EB in an interlocking manner with the illumination deflector assembly 16 to correct geometric aberrations in the illumination lens 12.

The image generating section 612 generates an image by accumulatively averaging image signals produced at different tilt angles of the electron beam whenever three scanning lines L are drawn across each one of scanning positions on the sample S, and displays the generated image on the display section 630. As a result, the DPC image having reduced diffraction contrast is displayed on the display section 630 in real time.

When the observed region has been fully scanned with the electron beam EB, the image generating section 612 generates three DPC images and accumulatively averages them, thus producing a final image. Alternatively, the image generating section 612 may create a final image by drawing three scanning lines L across the same scanning position on the sample S, producing an image signal at each different tilt angle, and accumulatively averaging such image signals. The image generating section 612 displays the created final image on the display section 630.

4. Advantageous Effects

The electron microscope 100 includes the illumination deflector assembly 16 located ahead of the aberration corrector 18, the segmented detector 40 operative to detect electrons and to generate image signals, and the image generating section 612 for generating DPC images from the image signals. The DPC images are created at different tilt angles of the electron beam EB achieved by the illumination deflector assembly 16, and the image generating section 612 creates a final image based on these DPC images.

In this way, in the electron microscope 100, the electron beam EB is tilted by the illumination deflector assembly 16 located ahead of the aberration corrector 18 and, therefore, geometric aberrations induced by tilting of the electron beam EB in the objective lens 22 can be canceled out by geometric aberrations produced by tilting of the beam EB in the aberration corrector 18. Consequently, it is possible to reduce variations of the geometric aberrations due to tilting of the electron beam EB. Thus, in the electron microscope 100, aberrations caused by tilting of the electron beam EB can be reduced and so DPC images of high quality can be derived.

Furthermore, in the electron microscope 100, the image generating section 612 creates a final image based on plural DPC images generated at different tilt angles of the electron beam EB and so a DPC image having reduced diffraction contrast can be derived.

In the electron microscope 100, the illumination deflector assembly 16 is located at the first stage and includes the first deflector 160*a* for deflecting the electron beam EB along the Y axis, the second deflector 160*b* located at the first stage and operative to deflect the beam EB along the X axis, the third deflector 162*a* located at the second stage and operative to deflect the beam EB along the Y axis, and the fourth deflector 162*b* disposed at the second stage and operative to deflect the beam EB along the X axis. When the first deflector 160*a* is made to deflect the electron beam EB along the Y axis, the control section 614 corrects, by the use of the third deflector 162*a* and fourth deflector 162*b*, the positional deviation of the electron beam EB on the sample S due to deflection of the beam EB by the first deflector 160*a*.

Therefore, in the electron microscope 100, positional deviation of the electron beam EB on the sample S due to tilting of the electron beam EB can be reduced and thus decrease in the image quality consequent to the positional deviation can be reduced. Hence, the electron microscope 100 can produce DPC images of high quality.

In the electron microscope 100, the control section 614 acquires a plurality of STEM images at different tilt angles of the electron beam EB and determines the deflection ratio of the first deflector 160*a*, second deflector 160*b*, third deflector 162*a*, and fourth deflector 162*b* based on the deviations among the STEM images. Therefore, in the electron microscope 100, positional deviation of the electron beam EB on the sample S due to tilting of the beam EB can be reduced and image quality deterioration due to such positional deviation can be reduced.

In the electron microscope 100, the control section 614 causes the illumination deflector assembly 16 to vary the tilt of the electron beam EB when the image generating section 612 is not operating to acquire an image signal. In the microscope 100, therefore, the illumination deflector assembly 16 has a finite response speed and so the output waveform would normally distort in response to an input waveform. However, in the electron microscope 100, the effect of such distortion can be reduced. Consequently, in the electron microscope 100, the electron beam EB can assume an optimum tilt angle according to the sample S.

In the electron microscope 100, scanning of the sample S with the electron beam EB is carried out by deflecting the beam EB with the scanning deflector 20 and drawing the plurality of scanning lines L. During the interval of time in which the electron beam EB is deflected back after drawing the first scanning line L1 out of the plural scanning lines L in preparation to draw the next second scanning line L2, the control section 614 causes the illumination deflector assembly 16 to vary the tilt of the beam EB. Therefore, in the electron microscope 100, the effect of distortion of the output waveform relative to the input waveform because of finite response speed of the illumination deflector assembly 16 can be reduced.

During the time interval between when the region of the sample S of interest is scanned and a STEM image is acquired and when the same region of the sample S is again scanned and a next STEM image is acquired, the image generating section 612 does not acquire any image signal. Therefore, during this interval, the control section 614 may instruct the illumination deflector assembly 16 to vary the tilt of the electron beam EB.

In the electron microscope 100, the same area of the sample S is scanned along the first and second scanning lines L1, L2. Furthermore, in the electron microscope 100, first and second image signals derived by drawing the first scanning signal L1 and the second scanning signal L2, respectively, are averaged to create an image. This can reduce the deviation between plural DPC images due to sample drift.

In the electron microscope 100, the image generating section 612 acquires first and second DPC images at different tilt angles of the electron beam EB and generates a final image based on the first and second DPC images. This can reduce the deviation of image due to sample drift between the first and second DPC images. In addition, the dependence on tilt angle can be analyzed or otherwise used using the first and second DPC images.

The electron microscope 100 includes the imaging deflector 24 for correcting positional deviation of the electron beam EB on the segmented detector 40 due to deflection of the beam EB with the illumination deflector assembly 16. Therefore, positional deviation of the image (electron beam EB) on the segmented detector 40 caused by tilting of the electron beam EB can be reduced and concomitant deterioration of image quality can be lessened. Consequently, the electron microscope 100 can derive DPC images of high quality.

In the electron microscope 100, aberrations in the illumination lens 12 are corrected using the scanning deflector 20. For this purpose, the control section 614 causes the scanning deflector 20 to tilt the electron beam EB according to the sample while scanning the sample S with the beam EB. In consequence, the electron microscope 100 can generate DPC images of high quality.

The electron microscope 100 includes the segmented detector 40 whose photosensitive surface 42 is divided into the plural detector segments D1, D2, D3, and D4. Hence, the electron microscope 100 can easily obtain DPC images.

5. Modified Embodiments

In the foregoing embodiment, positional deviation of the electron beam EB on the sample S caused by tilting of the beam EB is corrected by adjusting the deflection ratio of the first deflector 160*a*, second deflector 160*b*, third deflector 162*a*, and fourth deflector 162*b* and operating these four deflectors in an interlocking manner. In contrast, without adjusting the deflection ratio of the four deflectors, deviations in field of view among plural DPC images may be corrected by measuring the field of view vector illustrated in FIG. 7, producing the DPC images at different tilt angles of the electron beam EB, and correcting the deviations in field of view among the DPC images using the vector V.

The amount of positional deviation of the electron beam EB on the sample S when the beam EB is tilted varies according to geometric aberrations. For example, when STEM images are acquired, the focus is often adjusted and, therefore, the field of view deviation vector V representing focus variations may be found in advance, in which case the deviations in field of view among DPC images can be corrected in response to focus variations.

It is to be understood that the present invention is not restricted to the foregoing embodiment but rather can be implemented in various modified forms. For example, the present invention embraces configurations (e.g., configurations identical in function, method, and results or identical in purpose and advantageous effects) which are substantially identical to the configurations described in the above embodiment. Furthermore, the invention embraces configurations which are similar to the configurations described in the above embodiment except that their nonessential portions have been replaced. Additionally, the invention embraces configurations which are identical in advantageous effects to, or which can achieve the same object as, the configurations described in the above embodiment. Further, the invention embraces configurations which are similar to the configurations described in the above embodiment except that a well-known technique is added.

The invention claimed is:

1. An electron microscope comprising:

an electron source for emitting an electron beam;

an illumination lens for focusing the emitted electron beam;

an aberration corrector for correcting aberrations;

an illumination deflector assembly disposed ahead of the aberration corrector and operating to deflect the electron beam and to vary a tilt of the electron beam relative to a sample;

a scanning deflector for scanning the sample with the electron beam;

an objective lens;

a detector for detecting electrons transmitted through the sample and producing an image signal;

a control section for controlling the illumination deflector assembly; and an image generating section for receiving the image signal and generating a differential phase contrast (DPC) image, wherein the tilt of the electron beam is varied by the illumination deflector assembly such that the image generating section generates a plurality of DPC images at a plurality of different tilt angles of the electron beam and creates a final image by averaging the plurality of DPC images, wherein said illumination deflector assembly comprises:

a first deflector disposed at a first stage and operating to deflect the electron beam along a first axis;

a second deflector disposed at the first stage and operating to deflect the electron beam along a second axis intersecting the first axis;

a third deflector disposed at a second stage and operating to deflect the electron beam along the first axis; and a fourth deflector disposed at the second stage and operating to deflect the electron beam along the second axis;

wherein, when the first deflector is made to deflect the electron beam along the first axis, the control section corrects, by the use of the third and fourth deflectors, positional deviation of the electron beam on the sample caused by the deflection of the electron beam provided by the first deflector.

2. The electron microscope as set forth in claim 1, wherein said control section acquires a plurality of scanned images at different tilt angles of said electron beam and determines a deflection ratio of said first, second, third, and fourth deflectors based on deviations among the plurality of scanned images.

3. The electron microscope as set forth in claim 1, wherein said control section acquires a plurality of scanned images at different tilt angles of said electron beam, averages the scanned images to generate an averaged image, and determines a deflection ratio of said first, second, third, and fourth deflectors based on blur of the averaged image.

4. An electron microscope comprising:

an electron source for emitting an electron beam;

an illumination lens for focusing the emitted electron beam;

an aberration corrector for correcting aberrations;

an illumination deflector assembly disposed ahead of the aberration corrector and operating to deflect the electron beam and to vary a tilt of the electron beam relative to a sample;

a scanning deflector for scanning the sample with the electron beam;

an objective lens;

a detector for detecting electrons transmitted through the sample and producing an image signal;

a control section for controlling the illumination deflector assembly; and an image generating section for receiving the image signal and generating a differential phase contrast (DPC) image, wherein the tilt of the electron beam is varied by the illumination deflector assembly such that the image generating section generates a plurality of DPC images at a plurality of different tilt angles of the electron beam and creates a final image by averaging the plurality of DPC images, and wherein said control section causes said illumination deflector assembly to vary said tilt when said image generating section is not acquiring said image signal.

5. The electron microscope as set forth in claim 4, wherein scanning of said sample with the electron beam is carried out by deflecting the electron beam with said scanning deflector assembly and drawing a plurality of scanning lines, and wherein said control section causes said illumination deflector assembly to vary said tilt during a time interval between when a first scanning line of the plurality of scanning lines is drawn and when the electron beam is deflected back in preparation to draw a next, second scanning line of the plurality of scanning lines.

6. The electron microscope as set forth in claim 5, wherein a same area of said sample is scanned with both said first scanning line and said second scanning line.

7. The electron microscope as set forth in claim 6, wherein said image generating section generates said final image by averaging a first image signal and a second image signal which arise by drawing said first scanning line and said second scanning line, respectively.

8. The electron microscope as set forth in claim 6, wherein said image generating section generates said final image by acquiring a first DPC image and a second DPC image at different tilt angles of the electron beam and averaging the first and second DPC images.

9. The electron microscope as set forth in claim 1, further comprising an imaging deflector for correcting positional deviation of the electron beam on said detector caused by deflection of the electron beam with said illumination deflector assembly.

10. The electron microscope as set forth in claim 1, wherein aberrations in said illumination lens are corrected using said scanning deflector.

11. The electron microscope as set forth in claim 1, wherein said detector is a segmented detector having a photosensitive surface that is split into a plurality of detector segments.

12. An electron microscope comprising:

an electron source for emitting an electron beam;

an illumination lens for focusing the emitted electron beam;

an aberration corrector for correcting aberrations;

an illumination deflector assembly disposed ahead of the aberration corrector and operating to deflect the electron beam and to vary a tilt of the electron beam relative to a sample, wherein the illumination deflector assembly is disposed closer to the electron source than the aberration corrector so that the geometric aberrations in the objective lens caused by the tilt of the electron beam can be cancelled out by the geometric aberrations in the aberration corrector produced by the tilt of the beam;

a scanning deflector for scanning the sample with the electron beam;

an objective lens;

a detector for detecting electrons transmitted through the sample and producing an image signal;

a control section for controlling the illumination deflector assembly; and an image generating section for receiving the image signal and generating a differential phase contrast (DPC) image, wherein the tilt of the electron beam is varied by the illumination deflector assembly such that the image generating section generates a plurality of DPC images with plural different tilts of the electron beam and creates a final image by averaging the plurality of DPC images.

* * * * *